US010121985B2

(12) United States Patent
Ito

(10) Patent No.: US 10,121,985 B2
(45) Date of Patent: Nov. 6, 2018

(54) DISPLAY APPARATUS WITH OPTICAL INTERFERENCE LAYER HAVING A LARGER REFRACTIVE INDEX THAN A WHITE LIGHT EMITTING LAYER

(71) Applicant: CANON KABUSHIKI KAISHA, Tokyo (JP)

(72) Inventor: Takayuki Ito, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/786,478

(22) Filed: Oct. 17, 2017

(65) Prior Publication Data

US 2018/0114937 A1 Apr. 26, 2018

(30) Foreign Application Priority Data

Oct. 21, 2016 (JP) .................................. 2016-206800

(51) Int. Cl.
| | |
|---|---|
| *H01L 51/50* | (2006.01) |
| *H01L 27/32* | (2006.01) |
| *H04N 5/232* | (2006.01) |
| *H01L 51/52* | (2006.01) |

(52) U.S. Cl.
CPC .......... *H01L 51/504* (2013.01); *H01L 27/322* (2013.01); *H01L 51/5206* (2013.01); *H01L 51/5234* (2013.01); *H01L 51/5271* (2013.01); *H01L 51/5275* (2013.01); *H04N 5/23293* (2013.01); *H01L 27/3211* (2013.01); *H01L 2251/558* (2013.01)

(58) Field of Classification Search
CPC . H01L 51/504; H01L 27/322; H01L 51/5206; H01L 51/5234; H01L 51/5271; H01L 51/5275; H04N 5/23293
See application file for complete search history.

(56) References Cited

U.S. PATENT DOCUMENTS

| | | | | |
|---|---|---|---|---|
| 2004/0151895 | A1* | 8/2004 | Itoh | ........................... B32B 7/02 |
| | | | | 428/327 |
| 2008/0062359 | A1* | 3/2008 | Inaba | ...................... G02B 5/285 |
| | | | | 349/105 |
| 2009/0115706 | A1* | 5/2009 | Hwang | ............... H01L 27/3213 |
| | | | | 345/76 |

FOREIGN PATENT DOCUMENTS

JP        2008-210740 A        9/2008

* cited by examiner

*Primary Examiner* — Nicholas G Giles
(74) *Attorney, Agent, or Firm* — Canon U.S.A. Inc., IP Division

(57) ABSTRACT

A display apparatus includes on a substrate a plurality of light emitting elements in which an organic layer including a white light emitting layer is sandwiched between a lower transparent electrode and an upper electrode, and further includes a reflection layer and an optical interference layer provided between the light emitting elements and the substrate, wherein the optical interference layer is made of a material having a lower refractive index than the refractive index of the light emitting layer and the ratio (nr/nb) of a refractive index (nr) with respect to a red wavelength region to a refractive index (nb) with respect to a blue wavelength region is less than 0.95, and the orders of interference m for blue, green, and red wavelength regions are 5, 4, and 3, respectively, when the optical distance from the light emitting layer to the reflection layer is $(2m+1)\lambda/4\pm(1/8)\lambda$.

16 Claims, 8 Drawing Sheets

DISPLAY APPARATUS WITH OPTICAL INTERFERENCE LAYER HAVING A LARGER REFRACTIVE INDEX THAN A WHITE LIGHT EMITTING LAYER

BACKGROUND OF THE INVENTION

Field of the Invention

The present disclosure relates to full-color display apparatuses using a white light emitting element.

Description of the Related Art

In recent years, organic electronic elements using organic compounds with which coating film formation and low-temperature processing can be performed have been studied to take the place of electronic functional elements using inorganic compounds. Especially, light emitting elements including organic light emitting layers made of organic compounds, which are also referred to as organic electroluminescent elements or organic EL elements, have been rapidly developed.

To realize full-color display, the display apparatus needs basic colors, red (R), green (G), and blue (B). In the case of using light emitting elements as a light source, there are various methods of obtaining the three colors RGB. Examples include a method in which red-light, green-light, and blue-light emitting layers are separately applied and a method in which RGB color filters are used to separate white light from a white light emitting element into separate colors. Recent full-color display apparatuses include an increased number of pixels with a micronized pixel size. As it is difficult to micronize a high-resolution mask and conduct highly-accurate alignment, use of the method of separately applying organic light emitting layers of three colors can cause a problem of a decrease in yield rate. On the other hand, the method using a white light emitting element and RGB color filters is effective for improving the yield rate because it does not require separate applications using masks. However, since the white light emitting element emits a wide spectrum, which is a characteristic of an organic material, it is difficult to increase color purity, and this leads to a problem of a narrow color reproduction range. There is also a problem of increased power consumption due to low emission efficiency caused by low transmittance of the color filters.

Japanese Patent Application Laid-Open No. 2008-210740 (hereinafter, "Patent Document 1") discusses an arrangement in which the distance between a light emitting layer and a reflection layer of a light emitting element is set equal to a suitable distance for obtaining a resonance effect of red, blue, and green in order to improve color purity and facilitate productivity.

However, the display apparatus discussed in Patent Document 1 has a problem of a significant color shift depending on a viewing angle.

SUMMARY OF THE INVENTION

The present disclosure is directed to a full-color display apparatus with a white light emitting element which has an increased color reproduction range, reduced power consumption, and decreased viewing angle dependency while the ease of production is realized.

According to an aspect of the present disclosure, a display apparatus includes a substrate, a plurality of light emitting elements formed on the substrate, a reflection layer provided between the substrate and the light emitting elements, and an optical interference layer provided between the light emitting elements and the reflection layer, wherein the plurality of light emitting elements include a transparent lower electrode, an organic layer including a white light emitting layer, and an optically transparent upper electrode in this order from the substrate side, wherein an optical distance from the white light emitting layer to the reflection layer is equal in the plurality of light emitting elements, wherein the optical interference layer has a larger refractive index than a refractive index of the white light emitting layer and a ratio (nr/nb) of a refractive index (nr) with respect to a red wavelength region to a refractive index (nb) with respect to a blue wavelength region in the optical interference layer is less than 0.95, and wherein orders of interference m in the blue, green, and red wavelength regions are 5, 4, and 3, respectively, when the optical distance from the light emitting layer to the reflection layer is $(2m+1)\lambda/4\pm(1/8)\lambda$.

Further features will become apparent from the following description of exemplary embodiments with reference to the attached drawings.

DESCRIPTION OF THE EMBODIMENTS

Figure 1:
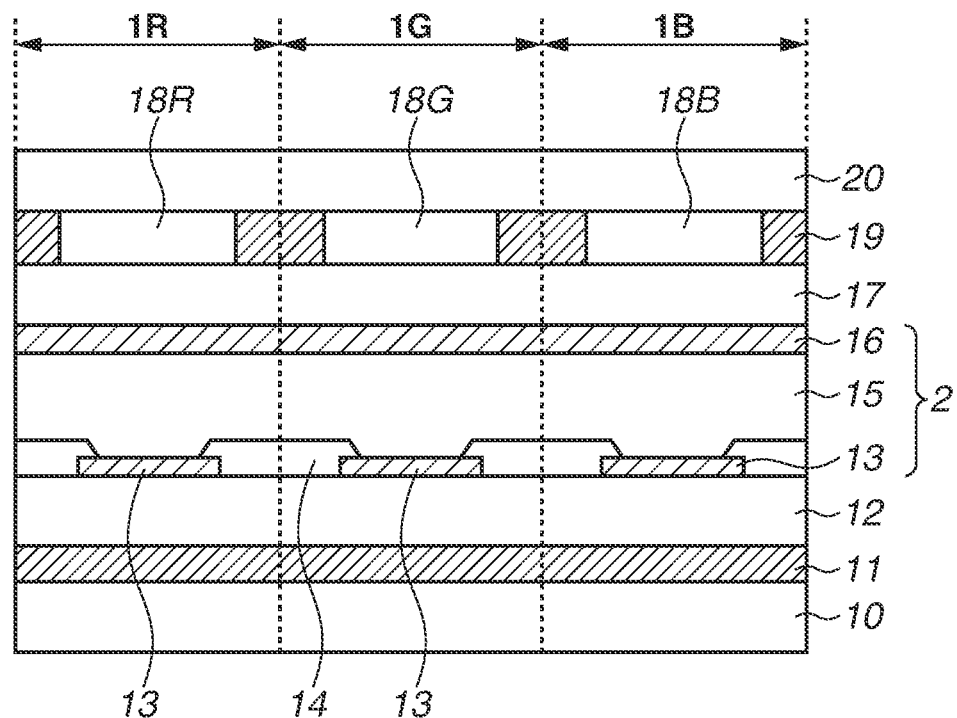
FIG. 1 is a cross-sectional view schematically illustrating a display apparatus according to an exemplary embodiment.

A display apparatus according to an exemplary embodiment of the present disclosure uses light emitting elements including a white light emitting layer. The light emitting elements for blue, green, and red have the same structure. The present exemplary embodiment is characterized in that the optical distance from the light emitting layer to a reflection layer is optimized by the thickness of an optical interference layer so that resonance effects are produced with respect to the respective colors and light of each color is emitted with high color purity.

The exemplary embodiment will be described below with reference to the drawings. The dimensions of respective components illustrated in the drawings are different from actual dimensions. Further, conventional and known techniques in the art apply to portions that are not illustrated or described herein.

FIG. 1 is a cross-sectional view schematically illustrating a display apparatus according to an exemplary embodiment. The display apparatus is a full-color, top-emission display apparatus. The display apparatus includes a substrate 10 and a plurality of light emitting elements 2 arranged in matrix on the substrate 10. Each of the light emitting elements 2 includes a transparent lower electrode (pixel electrode) 13, an organic layer 15, and an upper electrode 16 in this order from the substrate 10 side. Between the light emitting element 2 and the substrate 10 are provided a reflection layer 11 and an optical interference layer 12. An insulation layer (bank) 14 in FIG. 1 isolates the pixel electrode 13 from an adjacent pixel electrode 13.

In the present exemplary embodiment, since the top emission method is used in which light is extracted from an electrode located on the opposite side to the substrate 10, the substrate 10 can be a transparent or non-transparent substrate. The pixel electrode 13 and the upper electrode 16 are provided with wiring (not illustrated) for supplying power thereto to cause emission of light. The organic layer 15 sandwiched between the pixel electrode 13 and the upper electrode 16 includes at least a white light emitting layer (not illustrated). Further, color filters 18R, 18G, and 18B which respectively transmit red light, green light, and blue light are provided on the side of the light emitting elements 2 from which light is extracted, whereby white light emitted from the light emitting elements 2 is extracted outside the display apparatus as red light, green light, and blue light. Thus, a red pixel 1R, a green pixel 1G, and a blue pixel 1B of the display apparatus according to the present exemplary embodiment have the same structure except for the color filters 18R, 18G, and 18B (for convenience, the color filters 18R, 18G, and 18B will be referred to as "color filter 18" hereinafter). A black matrix 19 in FIG. 1 blocks light between the respective color filters 18.

Figure 2:
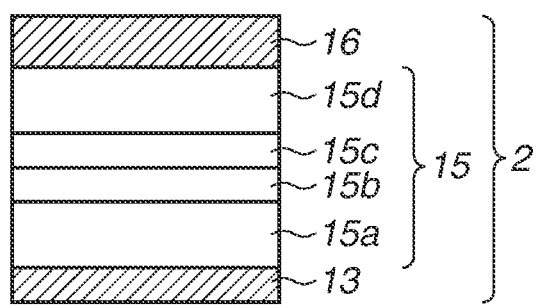
FIG. 2 is an enlarged cross-sectional view schematically illustrating a light emitting element of the display apparatus illustrated in FIG. 1.

The reflection layer 11 is made of a highly-reflective metal such as an aluminum alloy or silver alloy. The organic layer 15 needs to include a white light emitting layer and can have a multilayer structure as illustrated in FIG. 2. For example, in the case where the pixel electrode 13 is an anode, layers 15a, 15b, 15c, and 15d can be a hole transporting layer, a light emitting layer, a hole blocking layer, and an electron transporting layer, respectively. In addition to these layers, an electron blocking layer, a hole injection layer, an electron injection layer, etc. can be provided as needed in the organic layer 15. While the light emitting layer 15b in FIG. 2 is a single layer, the light emitting layer 15b can be a white light emitting layer including a plurality of layers each emitting a different color light. The plurality of light emitting layers can be in contact with each other, or other layers can be provided between the plurality of light emitting layers.

The upper electrode 16 is the optically transparent electrode located on the side where light is extracted. The upper electrode 16 can be a transparent electrode such as an indium tin oxide (ITO) electrode or a thin metal film. To improve color purity, use of a thin metal film with a high reflectance is desirable. In the case of using a thin metal film, a thin silver (Ag) alloy film containing an alkaline earth metal, such as magnesium (Mg) or calcium (Ca), or elemental Ag can be used.

Desirably, a transparent sealing film 17 is provided on the upper electrode 16 to prevent permeation of external oxygen and moisture to the organic layer 15. The transparent sealing film 17 has the role of protecting the light emitting elements 2 not only from external oxygen and moisture but also from the process of forming the color filter 18. On the color filter 18 can be provided a transparent protection substrate 20, such as glass or plastic, to protect the uppermost surface.

The pixel electrode 13 is made of a transparent, conductive oxide such as ITO or indium zinc oxide (IZO). White light emitted from the light emitting layer 15b and containing blue light, green light, and red light passes through the pixel electrode 13 and produces optical interference between the light emitting layer 15b and the reflection layer 11 and between the reflection layer 11 and the upper electrode 16. The optical distance from the light emitting layer 15b to the reflection layer 11 and the optical distance from the reflection layer 11 to the upper electrode 16 at this time can be adjusted such that simultaneous resonances (hereinafter, "multi-mode resonances") occur in red, green, and blue wavelength regions, for example, at around 650 nm, 530 nm, and 460 nm.

According to the present exemplary embodiment, the optical interference layer 12 for optical adjustment is made of a material which has a larger refractive index than the refractive index of the light emitting layer 15b and in which the ratio (nr/nb) of the refractive index (nr) of the red wavelength region to the refractive index (nb) of the blue wavelength region is less than 0.95, for the following reason.

It is known that, in general, a resonance effect is produced when the optical distance from the light emitting layer 15b to the reflection layer 11 is $(2m+1)\lambda/4$. When the orders m are 5, 4, and 3, and blue, green, and red wavelengths represented as $\lambda b$, $\lambda g$, and $\lambda r$, respectively, are assigned to the above-described condition, $(11/4)\lambda b$, $(9/4)\lambda g$, and $(7/4)\lambda r$ are obtained at which interference occurs to produce a resonance effect, and then in this condition, the following equation is likely to be satisfied, $$(11/4)\lambda b \approx (9/4)\lambda g \approx (7/4)\lambda r.$$

For example, if the blue wavelength $\lambda b$ is adjusted to 440 nm, the green and red wavelengths $\lambda g$ and $\lambda r$ can be caused to resonate at around 540 nm and 690 nm, respectively, which are peak wavelengths of green and red. Accordingly, a resonance mode (multi-mode resonances) having three peaks in blue, green, and red visible regions is generated. An error of $\pm(1/8)\lambda$ is allowed in the optical distance regardless of an emission wavelength. More preferably, an error of $\pm(1/16)\lambda$ is allowed.

Meanwhile, an optical distance is expressed as a product of refractive index×physical distance. Accordingly, a condition for obtaining a resonance effect based on the above-described condition is expressed as $$(11/4)\lambda b = nb \times d,$$

$$(9/4)\lambda g = ng \times d, \text{ and}$$

$$(7/4)\lambda r = nr \times d,$$

where nb, ng, and nr are respectively the refractive indexes for the blue, green, and red wavelength regions and d is the physical distance from the light emitting layer 15b to the reflection layer 11, supposing that the portion from the light emitting layer 15b to the reflection layer 11 is made of a homogeneous material.

Thus, $(nr/nb)=(7/11)\times(\lambda r/\lambda b)$ is obtained by transforming the equations.

When the resonance wavelength of red is not less than 670 nm, visual sensitivity is decreased, and red luminance is decreased. This causes an increase in power consumption. Thus, from the standpoint of power consumption, the resonance wavelength of red is desirably less than 670 nm. Accordingly, $\lambda r<670$ nm is satisfied if (nr/nb) is less than 0.95 when $\lambda b=450$ nm.

As illustrated in FIG. 1, the pixel electrode 13 and the optical interference layer 12 are provided between the light emitting layer 15b and the reflection layer 11, and the optical distance is the sum of values obtained by respectively multiplying refractive indexes by thicknesses. However, as described above, the pixel electrode 13 is made of ITO or IZO, and these materials having a high refractive index each satisfy (nr/nb)<0.95. Thus, according to the present exemplary embodiment, if the optical interference layer 12 satisfies (nr/nb)<0.95, multi-mode resonances are produced in the desired wavelengths of blue, green, and red.

The light emitting layer 15b is an organic material, so the refractive index of the light emitting layer 15b is approximately 1.6 to 1.9. Thus, to reduce dependence on the viewing angle, the optical interference layer 12 is desirably made of a transparent material having a high refractive index, such as titanium oxide ($TiO_2$), niobium oxide ($Nb_2O_3$), zirconium oxide, silicon nitride (SiN), zinc oxide (ZnO), molybdenum oxide ($MoO_3$), ITO, IZO, zinc sulfide (ZnS), or zinc selenide (ZnSe), used either singly or in combination of two or more. The optical interference layer 12 having a higher refractive index than the refractive index of the light emitting layer 15b is provided so that the dependence of the display apparatus on the viewing angle is reduced. When the refractive index of the optical interference layer 12 is higher than the refractive index of the light emitting layer 15b, the refraction angle of light traveling from the light emitting layer 15b toward the substrate 10 is smaller than the incident angle of the light. This is expected to produce an advantage that an effect of an outgoing angle from the light emitting layer 15b on reflection light reflected from the reflection layer 11 is minimized. Further, a material having a higher refractive index is more likely to have lower wavelength dispersibility (nr/nb). The optical interference layer 12 can be made of an organic material that satisfies the above-described refractive index condition. The optical interference layer 12 can also be made of a material with a refractive index adjusted to satisfy the above-described refractive index condition by changing the composition of the material or by combining different materials. While the optical interference layer 12 can be a conductive layer because the optical interference layer 12 can be divided by patterning between pixels, the optical interference layer 12 is desirably an insulating layer from the standpoint of production because it is only necessary to form the optical interference layer 12 entirely and uniformly and no patterning is needed.

According to the present exemplary embodiment, as described above, the optical distance from the light emitting layer 15b to the reflection layer 11 is adjusted such that the orders of interference m of $(2m+1)\lambda/4$ in the blue, green, and red wavelength regions are respectively 5, 4, and 3. Specifically, the optical distance is adjusted to obtain $(11/4)\lambda r$, $(9/4)\lambda g$, and $(7/4)\lambda b$. It should be noted that an error of approximately $\lambda/8$ is allowed in each optical distance. This condition and the above-described refractive index condition of the optical interference layer 12 are satisfied so that color shifts caused by a change in viewing angle are reduced.

The thickness of the optical interference layer 12 can be adjusted based on the thickness of the pixel electrode 13 and the thickness of the organic layer 15. The total physical thickness of the optical interference layer 12 and the pixel electrode 13 is adjusted to 400 nm to 600 nm so that the physical thickness of the organic layer 15 becomes 200 nm or smaller. This is desirable because an increase in driving voltage of the light emitting elements 2 can be prevented.

The organic layer 15 is a layer including at least the light emitting layer 15b which emits white light. While the light emitting layer 15b can be configured such that two materials including a blue light emitting dopant and a yellow light emitting dopant simultaneously emit light, the light emitting layer 15b is desirably configured such that three materials including a blue light emitting dopant, a green light emitting dopant, and a red light emitting dopant simultaneously emit light. The light emitting layer 15b can have a single- or multi-layer structure. In the case of the single-layer structure, the light emitting layer 15b can be prepared by quaternary vapor deposition of four materials including a host material of the light emitting layer 15b and red, green, and blue light emitting dopants. In the case of the multi-layer structure, the light emitting layer 15b can have a two-layer structure including a yellow light emitting layer with red and green light emitting dopants and a blue light emitting layer, or a three-layer structure including red, green, and blue light emitting dopants. Further, in the case of the multi-layer structure, an intermediate layer can be provided between light emitting layers to adjust light emission balance.

When the light emitting layer 15b is excessively thick and has a wide light emission distribution, or when the light emitting layer 15b includes a plurality of layers each emitting a different color and the light emitting layers are separated from each other by a distance of 50 nm or greater, a deviation from optical interference design can occur to cause a decrease in emission efficiency and/or a decrease in color purity. Thus, the thickness of the light emitting layer 15b is desirably adjusted to 50 nm or smaller, or the total light emitting region of the light emitting dopants of the respective colors is desirably adjusted to 50 nm or smaller. Further, in the case of the light emitting layer 15b having a multi-layer structure, the blue light emitting layer of the light emitting layer 15b is desirably situated on the upper electrode 16 side. More desirably, the red light emitting layer, the green light emitting layer, and the blue light emitting layer are stacked in this order from the reflection layer 11 side, from the standpoint of interference design.

The color filter 18 can be adjusted to optimize the transmittance for each color in order to obtain desired color purity.

Further, while FIG. 1 illustrates the structure according to the exemplary embodiment in which three-color pixels including the blue pixel 1B, the green pixel 1G, and the red pixel 1R are used to realize a full-color display, a white pixel can also be included in addition to the three-color pixels according to another exemplary embodiment. In this case, a filter of the color filter 18 that corresponds to the white pixel can be transparent. Being transparent indicates that the filter transmits light of every one of the red, green, and blue wavelength regions. Invisible light such as infrared light can be either transmitted or not transmitted. The white pixel is included in addition to the red, green, and blue pixels so that the power consumption can be further reduced.

The display apparatus according to an exemplary embodiment is for use in a television, a monitor of a personal computer (PC), a display unit of an image capturing apparatus, a display unit of a mobile phone, a car monitor, etc. Examples of the image capturing apparatus include a digital camera, and the display unit of the image capturing apparatus can be a display unit on the back side or a display unit stored in an electronic view finder (EVF), etc.

The image capturing apparatus including the display apparatus according to the exemplary embodiment can further include an active element connected to the display apparatus, an optical unit including a plurality of lenses, and an image capturing element configured to receive light transmitted through the optical unit. The display apparatus can display images captured by the image capturing element.

The display unit of the mobile phone can be a display unit having a display function only or a display unit further including an identification unit configured to identify positional coordinates. The positional coordinate identification unit can be a capacitance sensor.

The car monitor can be a monitor configured to display images to be used for checking an area surrounding the car or a monitor which shows a state such as the speed of the car.

In the following examples, optical characteristics of the display apparatus illustrated in FIG. 1 were evaluated by simulation. The organic layer 15 of the light emitting element 2 included a hole transporting layer, light emitting layers A and B, and an electron transporting layer in this order from the substrate 10 side. The reflection layer 11 was an aluminum layer having a thickness of 100 nm. The pixel electrode 13 was an IZO layer having a thickness of 50 nm. The thickness of the hole transporting layer of the organic layer 15 was 110 nm. The light emitting layer A was a green and red light emitting layer, and the thickness of the light emitting layer A was 10 nm. The light emitting layer B was a blue light emitting layer, and the thickness of the light emitting layer B was 10 nm. The thickness of the electron transporting layer was 40 nm. Further, the light emitting positions of the light emitting layers A and B were respectively on the upper electrode 16 side. The upper electrode 16 was a Ag layer with a thickness of 10 nm. The transparent sealing film 17 was a SiN film with a thickness of 2000 nm, and an upper part of the transparent sealing film 17 was a resin layer (not illustrated). An EL spectrum emitted to the resin layer was calculated in the simulation.

The EL spectrum was simulated by setting a case in which the light emitting dopants of the respective colors in the light emitting layers A and B emit the same number of photons, and combining the fluorescent spectra of the light emitting dopants with resonance effects acquired by simulation.

Figure 3:
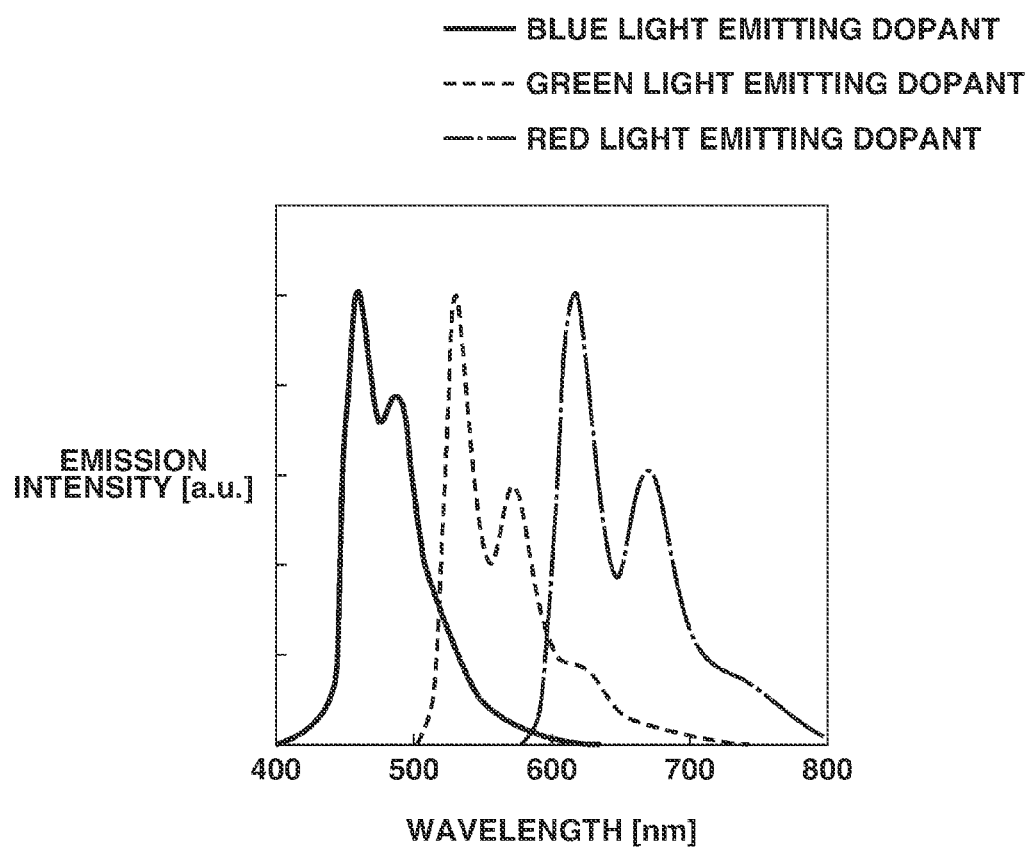
FIG. 3 is a graph illustrating fluorescent spectra of respective color light emitting dopants used in simulations.
Figure 4:
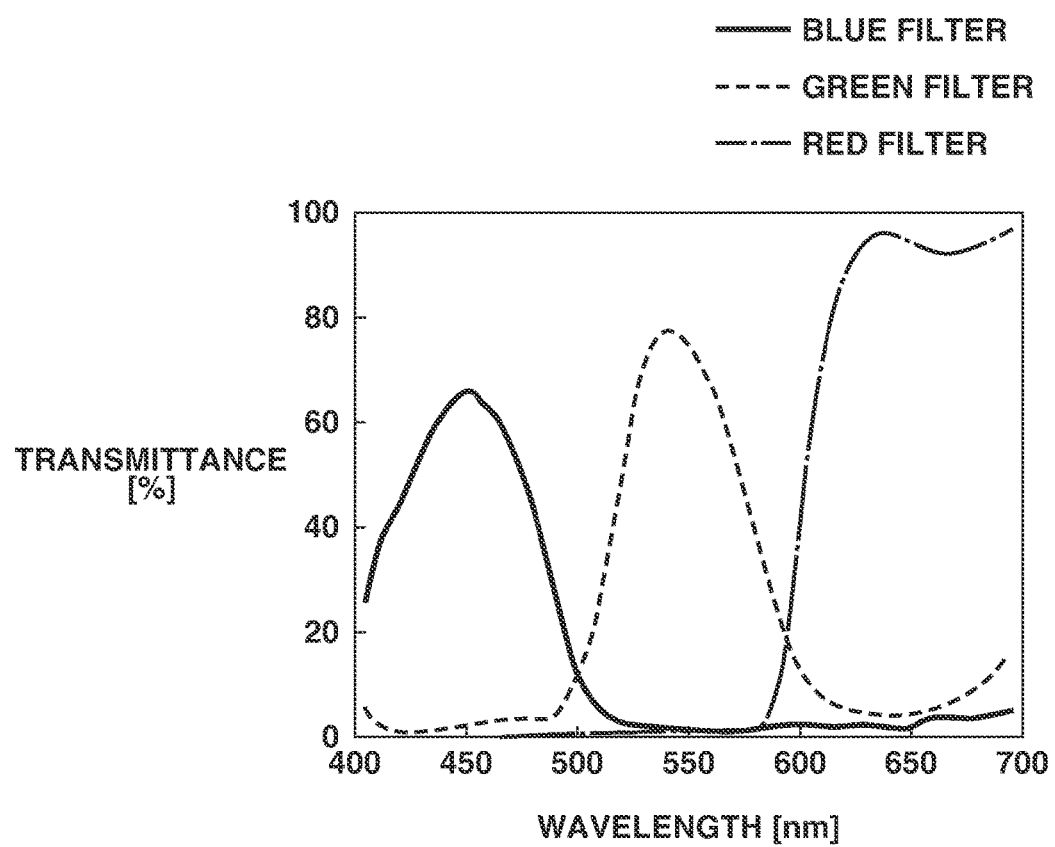
FIG. 4 is a graph illustrating transmission characteristics of color filters used in simulations.

FIG. 3 illustrates the fluorescent spectra of the light emitting dopants that were used. Further, the obtained EL spectrum is combined with each spectroscopic characteristic of the color filter 18 (FIG. 5) to obtain an EL spectrum for each color pixel. From the EL spectrum for each color pixel, National Television System Committee (NTSC) coverage, color reproduction range, and power consumption were evaluated. The NTSC coverage is a value obtained by calculating the International Commission on Illumination (CIE) 1931 (x, y) chromaticity from the EL spectrum of each color pixel and dividing the area of a region where a triangle formed by the NTSC values overlaps a triangle formed by the calculated chromaticity values of the respective colors by the area of the triangle formed by the NTSC values. The NTSC values were blue (0.14, 0.08), green (0.21, 0.71), and red (0.67, 0.33). Further, as to the power consumption, a luminance ratio at the time of producing white (0.31, 0.33) of predetermined luminance was calculated based on the red, green, and blue chromaticity values obtained for each color pixel, and the power consumption was estimated with the voltage being constant. Further, as to the viewing angle dependence, a case of radiation from an internal light emitting point in an oblique direction at $\theta=20°$ with respect to a front direction at an angle $\theta=0°$ was simulated, and color shifts in the front direction and the oblique direction were evaluated to evaluate the viewing angle dependence based on a change in the color reproduction range.

Optical constants of materials that were used in the simulation are from data obtained by spectroscopic ellipsometry measurement or from literature data.

Figure 5:
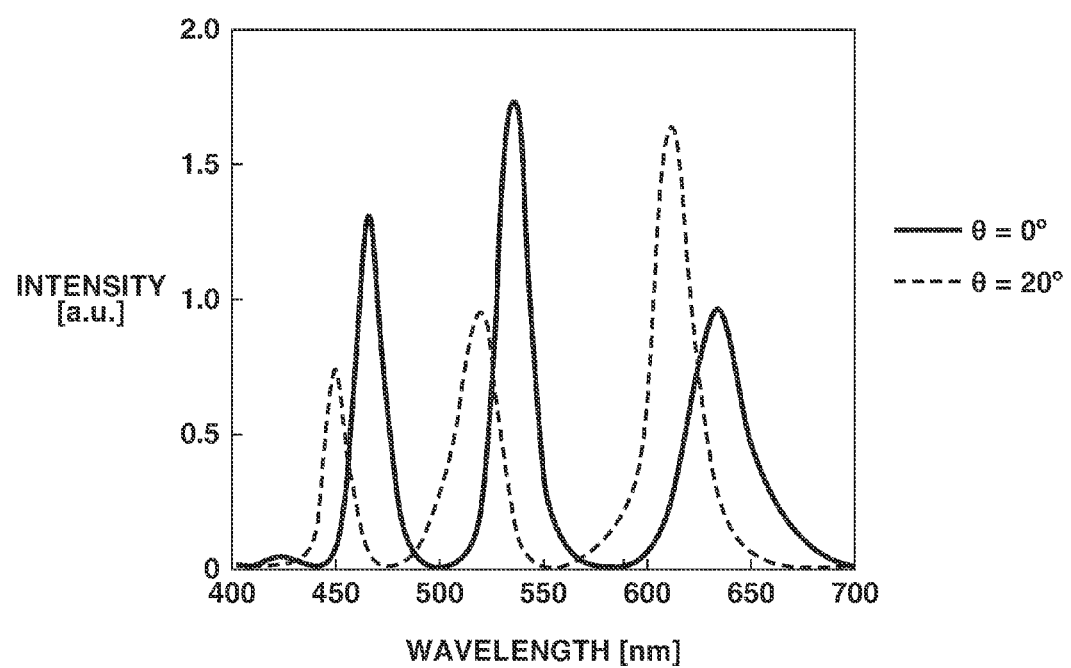
FIG. 5 is a graph illustrating electroluminescent (EL) spectra according to a first comparative example.

In a first comparative example, the optical interference layer 12 was a SiN layer with a thickness of 570 nm. The orders of interference m for blue ($\lambda b=460$ nm), green ($\lambda g=530$ nm), and red ($\lambda r=630$ nm) were respectively 6, 5, and 4. In other words, evaluations were performed for the orders of interference that are one order higher than those according to the exemplary embodiment. Specifically, this is a condition under which the optical distances from the light emitting layers A and B to the reflection layer 11 are $(13/4)\lambda b$, $(11/4)\lambda g$, and $(9/4)\lambda r$. As to optical characteristics of SiN, a refractive index n450 at a wavelength of 450 nm was 1.99, and the ratio (n650/n450) of a refractive index n650 at a wavelength of 650 nm to the refractive index n450 was 0.98. FIG. 5 illustrates EL spectra of light emitted to the resin layer at an internal light emitting angle $\theta=0°$ and $20°$.

The NTSC coverage according to the first comparative example was 93.8% in the front direction and 67.0% in the oblique direction, which is a significant drop. Further, the NTSC ratio also dropped. The drops were caused by color shifts due to significant shifts of blue and green light emission peaks to shorter wavelengths. For example, in green pixels, red light leaks easily from the green filter 18G, and in blue pixels, green light leaks from the blue filter 18B. In second and third comparative examples and a first example below, the power consumption is specified relative to the power consumption in the first comparative example which is defined as 1.

Figure 6:
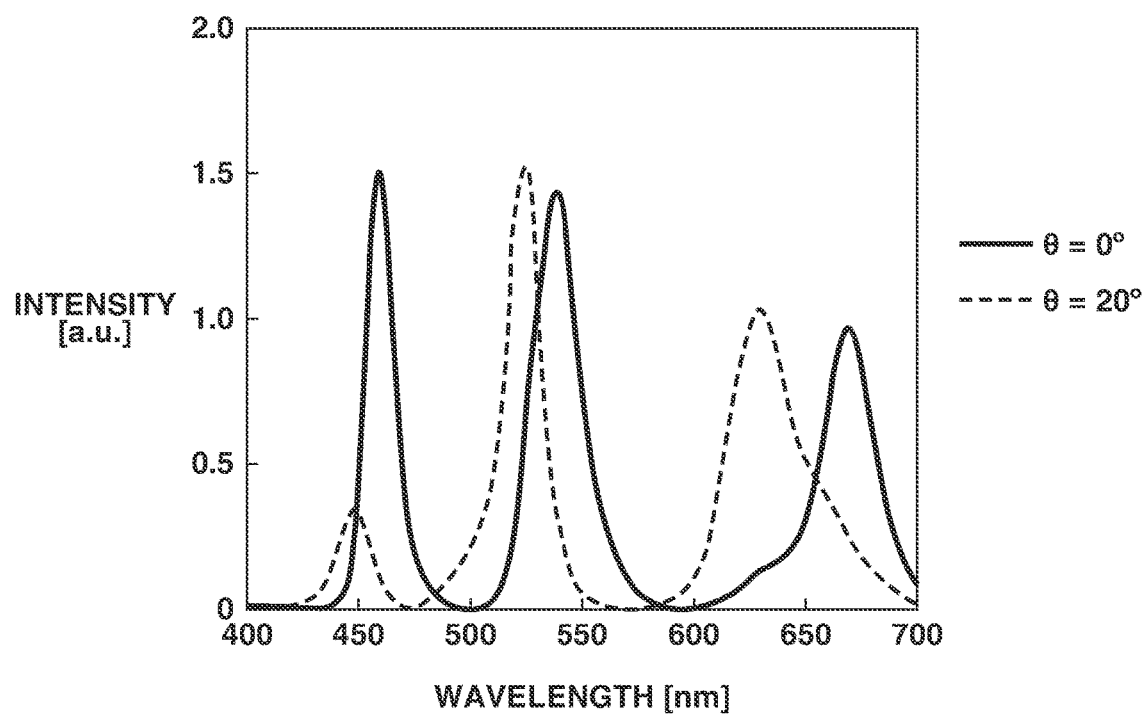
FIG. 6 is a graph illustrating EL spectra according to a second comparative example.

In the second comparative example, a similar structure to the structure according to the first comparative example, except that the thickness of the SiN layer as the optical interference layer 12 was 440 nm, was evaluated. The optical distances from the light emitting layers A and B to the reflection layer 11 were $(11/4)\lambda b$, $(9/4)\lambda g$, and $(7/4)\lambda r$ for $\lambda b=460$ nm, $\lambda g=540$ nm, and $\lambda r=670$ nm. FIG. 6 illustrates the obtained EL spectrum.

The NTSC coverage in the second comparative example was 89.8% in the front direction and 93.2% in the oblique direction, and color shifts caused by the viewing angle were reduced. However, the power consumption in the front direction was 1.40, which is greater than the power consumption of 1 in the first comparative example. This is due to low wavelength dispersibility, as the ratio (n650/n450) indicating the wavelength dispersibility of the SiN layer which is the optical interference layer 12 is 0.98. Thus, multi-mode resonance peaks coincide at a higher wavelength than 650 nm to cause a decrease in red luminance in a low visual sensitivity region.

Figure 7:
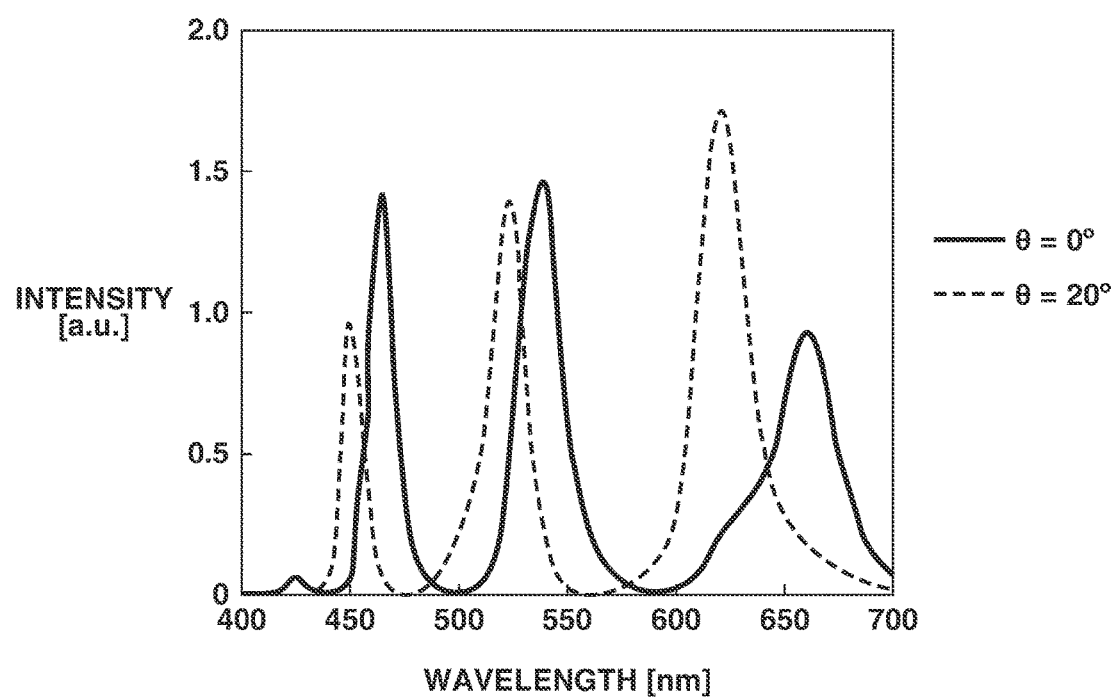
FIG. 7 is a graph illustrating EL spectra according to a third comparative example.

In the third comparative example, a similar structure to the structure according to the first comparative example, except that the optical interference layer 12 with a thickness 490 of nm was formed using an organic material (Org1) having a smaller refractive index than the light emitting layers A and B, was evaluated. The orders of interference m for blue ($\lambda b=465$ nm), green ($\lambda g=543$ nm), and red ($\lambda r=658$ nm) were respectively 5, 4, and 3. This is a condition under which the optical distances from the light emitting layers A and B to the reflection layer 11 are $(11/4)\lambda b$, $(9/4)\lambda g$, $(7/4)\lambda r$. As to the optical characteristics of the organic material Org1, the refractive index n450 at the wavelength of 450 nm was 1.86, and the ratio (n650/n450) of the refractive index n650 to the refractive index n450 at the wavelength of 650 nm was 0.92. FIG. 7 illustrates the obtained EL spectrum.

The NTSC coverage according to the third comparative example was 91.1% in the front direction and 82.3% in the oblique direction, and a color shift occurred in the oblique direction. This is due to a lower refractive index of the optical interference layer 12 than the refractive indexes of the light emitting layers A and B. Further, the power consumption in the front direction was 1.17 with respect to the power consumption of 1 in the first comparative example.

Figure 8:
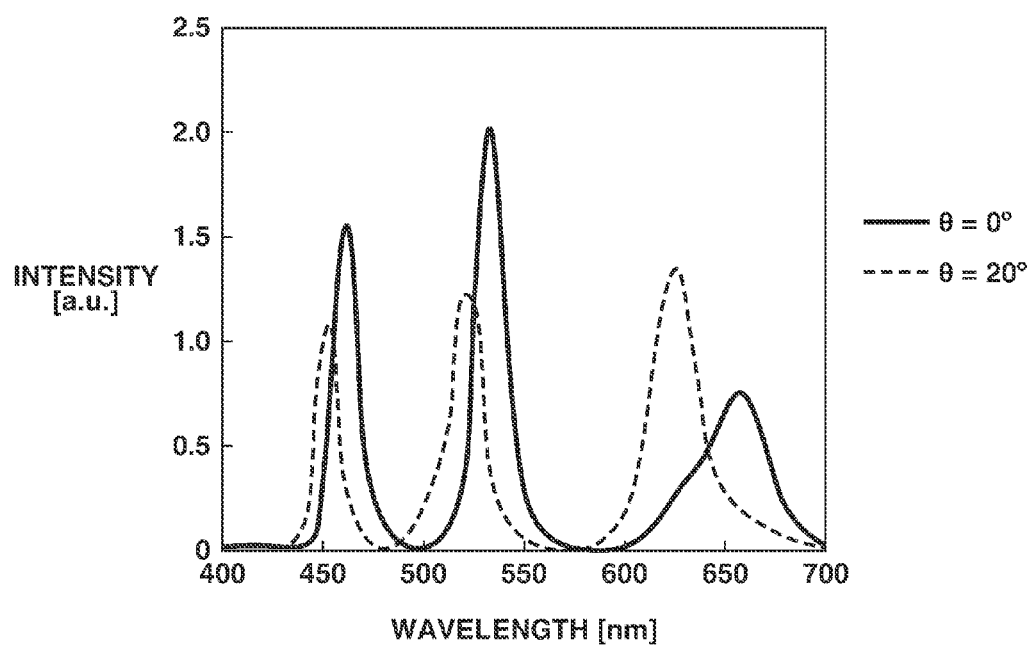
FIG. 8 is a graph illustrating EL spectra according to a first example.

In the first example, a similar structure to the structure according to the first comparative example, except that the optical interference layer 12 was a titanium oxide ($TiO_2$)

layer with a thickness of 368 nm, was evaluated. As to the optical characteristics of $TiO_2$ used, the refractive index n450 at the wavelength of 450 nm was 2.44, and the ratio (n650/n450) of the refractive index n650 at the wavelength of 650 nm to the refractive index n450 was 0.91. The orders of interference m for blue ($\lambda b$=460 nm), green ($\lambda g$=535 nm), and red ($\lambda r$=655 nm) were respectively 5, 4, and 3. Specifically, this is a condition under which the optical distances from the light emitting layers A and B to the reflection layer 11 are (11/4)$\lambda$.b, (9/4)$\lambda$.g, (7/4)$\lambda$.r. FIG. 8 illustrates the obtained EL spectrum.

The NTSC coverage according to the first example was 98.1% in the front direction and 92.7% in the oblique direction, and color shifts caused by the viewing angle are reduced. Further, the power consumption in the front direction was 1.15 with respect to 1 in the first comparative example, which is lower than those in the second and third comparative examples. This is because the ratio n650/n450 was 0.91 and, thus, the red resonance wavelength in the multi-mode resonance wavelength was in an appropriate position.

In second, third, and fourth examples, similar structures to the structure according to the first example, except that a niobium oxide ($Nb_2O_3$) layer, an ITO layer, and an IZO layer, each of which is a transparent oxide layer having a high refractive index, were used as the optical interference layer 12, were evaluated. The results are shown in Table 1.

TABLE 1

| | | First Comparative Example | Second Comparative Example | Third Comparative Example |
|---|---|---|---|---|
| Optical Interference Layer | Material | SiN | SiN | Org1 |
| | Thickness (nm) | 570 | 440 | 490 |
| | n450 | 1.99 | 1.99 | 1.86 |
| n650/n450 | | 0.98 | 0.98 | 0.92 |
| Orders of Interference m (Blue, Green, Red) | | 6, 5, 4 | 5, 4, 3 | 5, 4, 3 |
| Power Consumption | | 1 | 1.40 | 1.17 |
| NTSC Coverage (NTSC Ratio) | Front Direction $\theta = 0°$ | 93.8% (106.0%) | 89.8% (107.0%) | 91.1% (105.7%) |
| | Oblique Direction $\theta = 20°$ | 67.0% (71.1%) | 93.2% (101.8%) | 82.3% (90.0%) |

| | | First Example | Second Example | Third Example | Fourth Example |
|---|---|---|---|---|---|
| Optical Interference Layer | Material | $TiO_2$ | $Nb_2O_3$ | IZO | ITO |
| | Thickness (nm) | 368 | 355 | 410 | 520 |
| | n450 | 2.44 | 2.45 | 2.20 | 1.97 |
| n650/n450 | | 0.91 | 0.94 | 0.92 | 0.90 |
| Orders of Interference m (Blue, Green, Red) | | 5, 4, 3 | 5, 4, 3 | 5, 4, 3 | 5, 4, 3 |
| Power Consumption | | 1.15 | 1.16 | 1.23 | 1.22 |
| NTSC Coverage (NTSC Ratio) | Front Direction $\theta = 0°$ | 98.1% (112.7%) | 98.0% (115.6%) | 94.5% (109.1%) | 92.4% (105.0%) |
| | Oblique Direction $\theta = 20°$ | 92.7% (104.5%) | 92.3% (102.8%) | 91.7% (101.9%) | 90.0% (99.4%) |

As shown in Table 1, in the first to fourth examples, the NTSC coverage is 90% or higher in both the front and oblique directions, and the viewing angle dependence is reduced without increasing the power consumption, compared to the first to third comparative examples.

The display apparatus according to the present exemplary embodiment is easy to manufacture because all the pixels have the same structure except for the color filter, produces suitable resonance effects with respect to the respective colors, and has an improved color reproduction range and decreased viewing angle dependence without an increase in power consumption.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-206800, filed Oct. 21, 2016, which is hereby incorporated by reference herein in its entirety.

What is claimed is:

1. A display apparatus comprising:
a substrate;
a plurality of light emitting elements formed on the substrate;
a reflection layer provided between the substrate and the light emitting elements; and
an optical interference layer provided between the light emitting elements and the reflection layer,
wherein the plurality of light emitting elements includes a transparent lower electrode, an organic layer including a white light emitting layer, and an optically transparent upper electrode in this order from the substrate side,
wherein an optical distance from the white light emitting layer to the reflection layer is equal in the plurality of light emitting elements,
wherein the optical interference layer has a larger refractive index than a refractive index of the white light emitting layer and a ratio (nr/nb) of a refractive index (nr) with respect to a red wavelength region to a refractive index (nb) with respect to a blue wavelength region in the optical interference layer is less than 0.95, and
wherein orders of interference m in the blue, green, and red wavelength regions are 5, 4, and 3, respectively, when the optical distance from the light emitting layer to the reflection layer is (2m+1)$\lambda$/4±(⅛)$\lambda$, wherein $\lambda$ represents wavelength.

2. The display apparatus according to claim 1, wherein the ratio (nr/nb) is a ratio of a refractive index at a wavelength of less than 670 nm to a refractive index at a wavelength of 450 nm in the red wavelength region.

3. The display apparatus according to claim 2, wherein the (nr/nb) is a ratio of a refractive index at a wavelength of 650 nm to the refractive index at the wavelength of 450 nm.

4. The display apparatus according to claim 1, wherein the optical interference layer comprising a transparent material having a high refractive index.

5. The display apparatus according to claim 4, wherein the transparent material is selected from the group consisting of titanium oxide, niobium oxide, zirconium oxide, silicon nitride, zinc oxide, molybdenum oxide, indium tin oxide (ITO), indium zinc oxide (IZO), zinc sulfide, and zinc selenide.

6. The display apparatus according to claim 1, further comprising a color filter configured to transmit each of light of the red wavelength region, light of the green wavelength region, and light of the blue wavelength region.

7. The display apparatus according to claim 6, wherein the color filter further includes a region configured to transmit light of all the red, green, and blue wavelength regions.

8. The display apparatus according to claim 1, wherein the optical distance from the light emitting layer to the reflection layer is $(2m+1)\lambda/4 \pm (1/16)\lambda$.

9. The display apparatus according to claim 1, wherein total thickness of the optical interference layer and the transparent lower electrode is 400 nm or more and 600 nm or less.

10. The display apparatus according to claim 1, wherein the thickness of the organic layer is 200 nm or less.

11. The display apparatus according to claim 9, wherein the thickness of the organic layer is 200 nm or less.

12. The display apparatus according to claim 1, the white light emitting layer comprising two light emitting layers.

13. The display apparatus according to claim 1, the white light emitting layer comprising three light emitting layers.

14. The display apparatus according to claim 1, thickness of the white light emitting layer is 50 nm or less.

15. The display apparatus according to claim 1, the white light emitting layer comprising a plurality of light emitting layers, the total thickness of the light emitting layers is 50 nm or less.

16. An image capturing apparatus comprising:
   an optical unit including a plurality of lenses;
   an image capturing element configured to receive light transmitted through the optical unit; and
   a display apparatus configured to display an image captured by the image capturing element,
   wherein the display apparatus is the display apparatus according to claim 1.

* * * * *